(12) United States Patent
Hirano et al.

(10) Patent No.: US 8,500,454 B2
(45) Date of Patent: Aug. 6, 2013

(54) ELECTRONIC APPARATUS

(75) Inventors: Masayoshi Hirano, Kawasaki (JP); Eiji Makabe, Kawasaki (JP); Takashi Imamoto, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 13/010,970

(22) Filed: Jan. 21, 2011

(65) Prior Publication Data

US 2011/0117754 A1 May 19, 2011

Related U.S. Application Data

(63) Continuation of application No. PCT/JP2008/063355, filed on Jul. 25, 2008.

(51) Int. Cl.
*H01R 12/00* (2006.01)
(52) U.S. Cl.
USPC ............................................. 439/62; 361/788
(58) Field of Classification Search
USPC ................ 439/59, 61, 62; 361/727, 737, 752, 361/756, 788, 790, 800
See application file for complete search history.

(56) References Cited

U.S. PATENT DOCUMENTS

| | | | | |
|---|---|---|---|---|
| 5,530,623 A | * | 6/1996 | Sanwo et al. | 361/788 |
| 5,594,621 A | * | 1/1997 | van Rumpt | 361/679.32 |
| 5,926,378 A | * | 7/1999 | DeWitt et al. | 361/788 |
| 6,163,464 A | | 12/2000 | Ishibashi et al. | |

(Continued)

FOREIGN PATENT DOCUMENTS

JP 50-27345 3/1975
JP 60-185381 12/1985

(Continued)

OTHER PUBLICATIONS

International Search Report, PCT/ISA/210, mailed Sep. 16, 2008, in PCT/JP2008/063355.

(Continued)

*Primary Examiner* — Thanh Tam Le
(74) *Attorney, Agent, or Firm* — Staas & Halsey LLP

(57) ABSTRACT

An electronic apparatus includes: a first connector; a second connector; a first electronic unit connectable to the first connector; a second electronic unit connectable to the second connector; and a printed circuit board that includes the first connector and the second connector between a first extended center line toward a unit board of the first electronic unit and a second extended center line toward a unit board of the second electronic unit on a first side of the printed circuit board when the first and second electronic units are connected to the first and second connectors, respectively.

4 Claims, 14 Drawing Sheets

U.S. PATENT DOCUMENTS

| | | | |
|---|---|---|---|
| 6,328,572 B1 * | 12/2001 | Higashida et al. | 439/61 |
| 6,335,867 B1 * | 1/2002 | Ishibashi et al. | 361/788 |
| 6,392,142 B1 * | 5/2002 | Uzuka et al. | 174/541 |
| 6,422,876 B1 * | 7/2002 | Fitzgerald et al. | 439/61 |
| 6,538,899 B1 * | 3/2003 | Krishnamurthi et al. | 361/788 |
| 6,542,373 B1 * | 4/2003 | Oba | 361/760 |
| 7,014,472 B2 * | 3/2006 | Fjelstad et al. | 439/65 |
| 7,042,735 B2 * | 5/2006 | Koga et al. | 361/788 |
| 7,136,290 B1 * | 11/2006 | Wise | 361/788 |
| 7,154,761 B1 * | 12/2006 | Camerlo et al. | 361/788 |
| 7,193,861 B2 * | 3/2007 | Uzuka et al. | 361/786 |
| 7,227,759 B2 * | 6/2007 | Grundy et al. | 361/785 |
| 7,298,625 B1 * | 11/2007 | Wu et al. | 361/735 |
| 7,359,216 B2 * | 4/2008 | Hall | 361/796 |
| 7,365,964 B2 * | 4/2008 | Donahue, IV | 361/622 |
| 7,679,933 B2 * | 3/2010 | Makabe | 361/801 |
| 7,764,511 B2 * | 7/2010 | Lee et al. | 361/796 |
| 7,848,115 B2 * | 12/2010 | Casto et al. | 361/788 |

FOREIGN PATENT DOCUMENTS

| | | |
|---|---|---|
| JP | 61-205194 | 12/1986 |
| JP | 11-53077 | 2/1999 |
| JP | 2004-503890 | 2/2004 |
| JP | 2007-305990 | 11/2007 |

OTHER PUBLICATIONS

Japanese Office Action mailed Apr. 2, 2013 for corresponding Japanese Application No. 2010-521567.

Korean Office Action mailed Mar. 11, 2013 in corresponding Patent Application No. 10-2011-7001562.

* cited by examiner

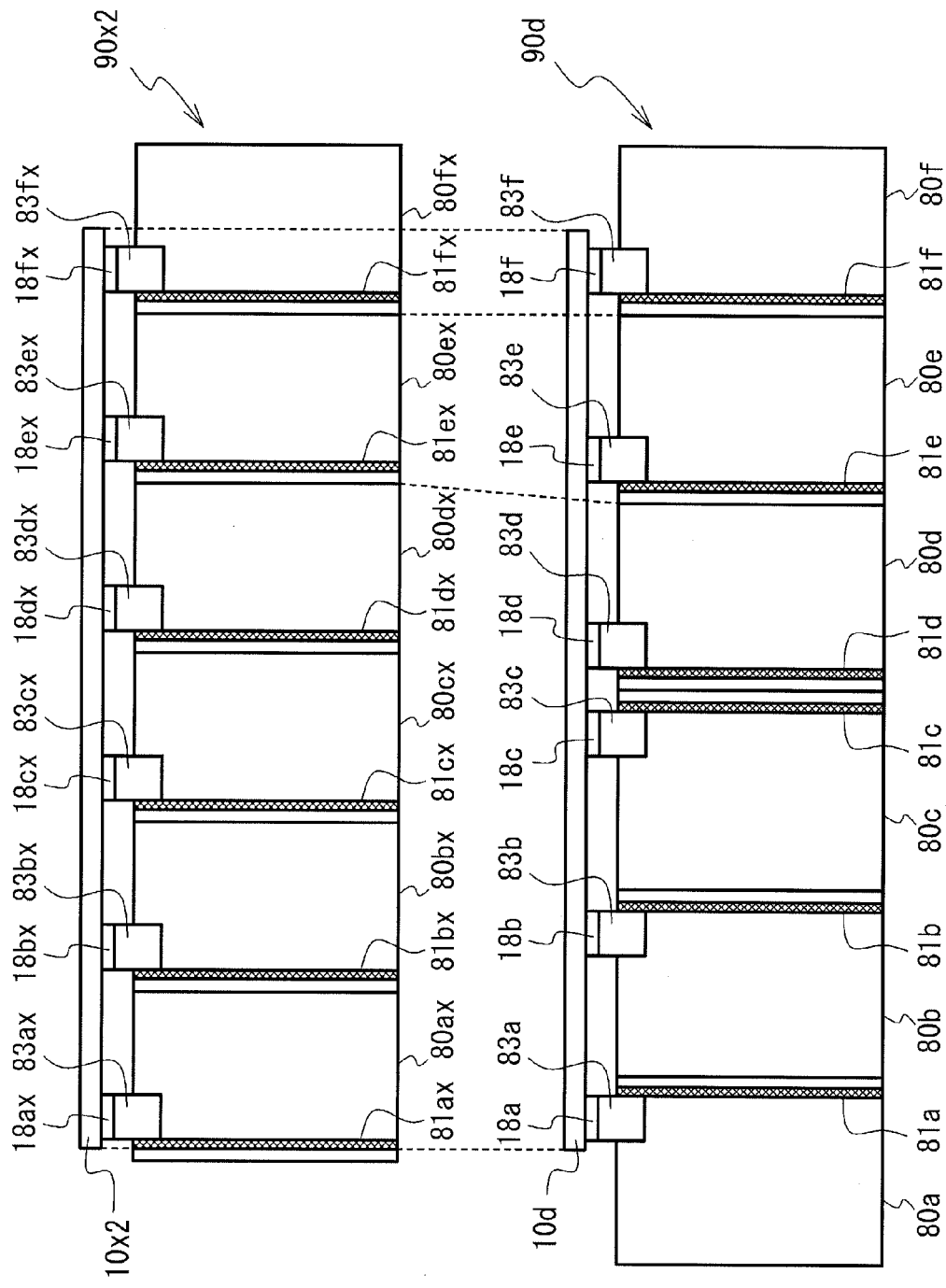

ELECTRONIC APPARATUS

CROSS-REFERENCE TO RELATED APPLICATION

This application is a continuation application of PCT/JP2008/063355, filed on Jul. 25, 2008, the entire contents of which are incorporated herein by reference.

FIELD

The embodiment discussed herein is related to an electronic apparatus.

BACKGROUND

There is known an electronic apparatus which includes: a backplane provided with plural connectors; and plural electronic units respectively connected to the connectors. The electronic unit has a unit board on which electronic parts are mounted. The unit board and the backplane are electrically connected to each other, whereby signals and electricity are supplied to the electronic parts mounted on the unit board. For example, there is known a technique of connecting electronic units each having a different shape factor to the backplane efficiently within a given space (See Japanese Unexamined Patent Application Publication (Translation of PCT Application) No. 2004-503890).

Since the plural electronic units are connected to the backplane, so that the great ratio of the backplane is occupied in the whole electronic apparatus. Thus, even if the electronic unit is able to be connected efficiently in the limited space, the whole electronic apparatus might be large when the backplane is large. The upsizing of an electronic apparatus causes the degradation of the cooling efficiency, the increase in the production cost with the upsizing of the housing or the cooling fan, and the increase in its weight.

SUMMARY

An electronic apparatus discussed herein includes: a first connector; a second connector; a first electronic unit connectable to the first connector; a second electronic unit connectable to the second connector; and a printed circuit board that includes the first connector and the second connector between a first extended center line toward a unit board of the first electronic unit and a second extended center line toward a unit board of the second electronic unit on a first side of the printed circuit board when the first and second electronic units are connected to the first and second connectors, respectively.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIGS. 14A and 14B are comparative views of a unit system according to a fifth embodiment and a unit system having a structure different from that of the unit system according to the fifth embodiment.

DESCRIPTION OF EMBODIMENTS

The embodiments according to the present invention will be explained with reference to the accompanying drawings as follows.

Figure 1:
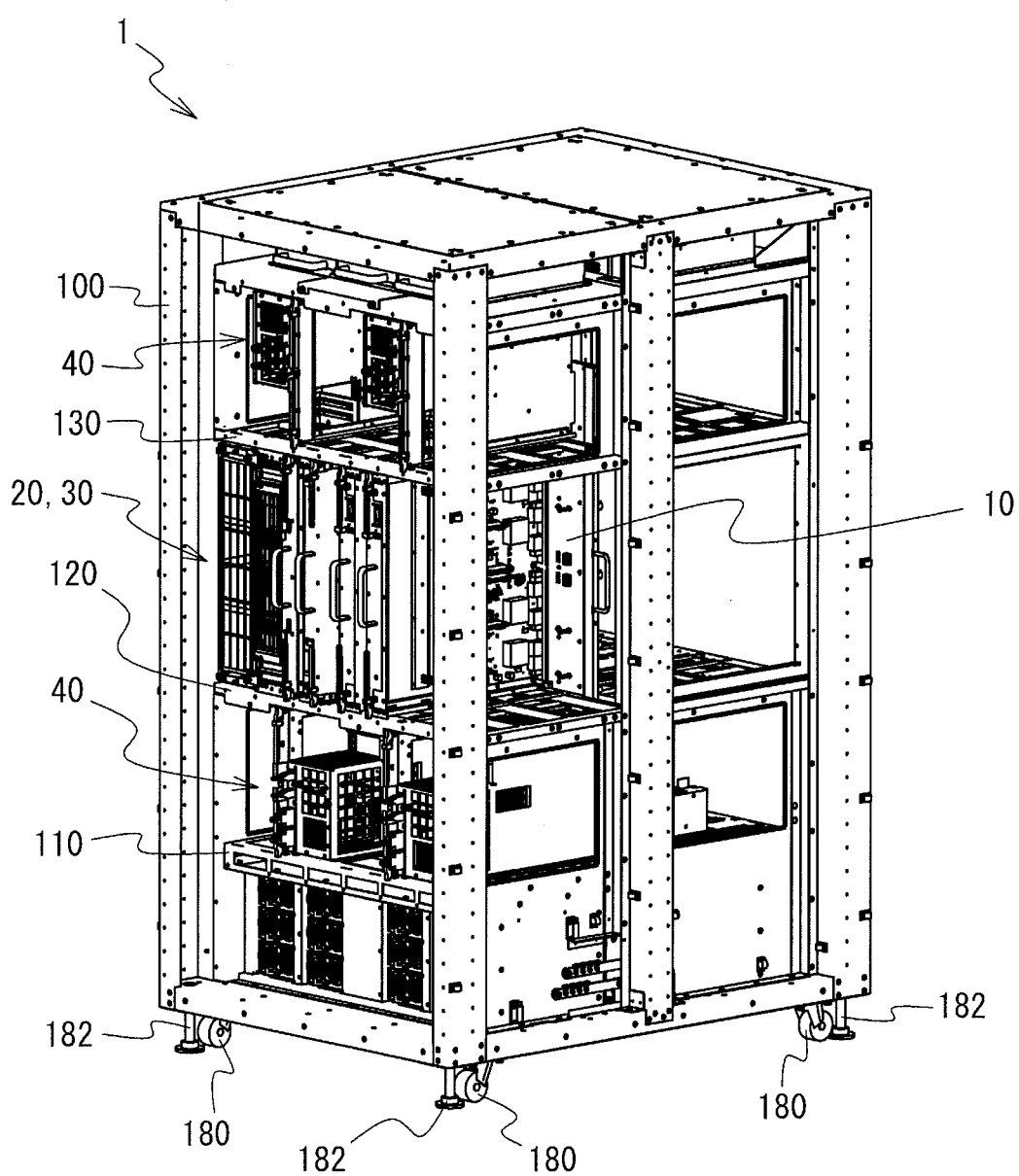
FIG. 1 is a perspective view of a server.

An electronic apparatus according to an example of the embodiments will be explained. A server 1 will be explained as an example of an electronic apparatus. FIG. 1 is a perspective view of the server 1. The server 1 includes: a frame 100; a backplane (printed circuit board) 10 held in the frame 100, units 20, 30, and 40 electrically connected to the backplane 10. Additionally, FIG. 1 illustrates the state where a side board provided at the side of the frame 100 is removed.

The units 20, 30, and 40 each include a unit board mounting electronic parts such as a microprocessor, memory, a hard disk, and a heat sink. The backplane 10 is provided for supplying a signal and electricity to the units 20, 30, and 40. The units 20, 30, and 40 can be attached to or detached from the backplane 10. The units 40 are arranged on a lower rack 110 and on a upper rack of the frame 100. The units 20 and 30 are arranged on a middle rack 120. The units 20 and 30 are connected to a middle portion of the backplane 10. The units 40 are arranged in the upper and lower sides to sandwich units 20 and 30. The frame 100 is provided at its bottom portion with casters 180 for moving and with stoppers 182 for prevention of the moving.

Figure 2:
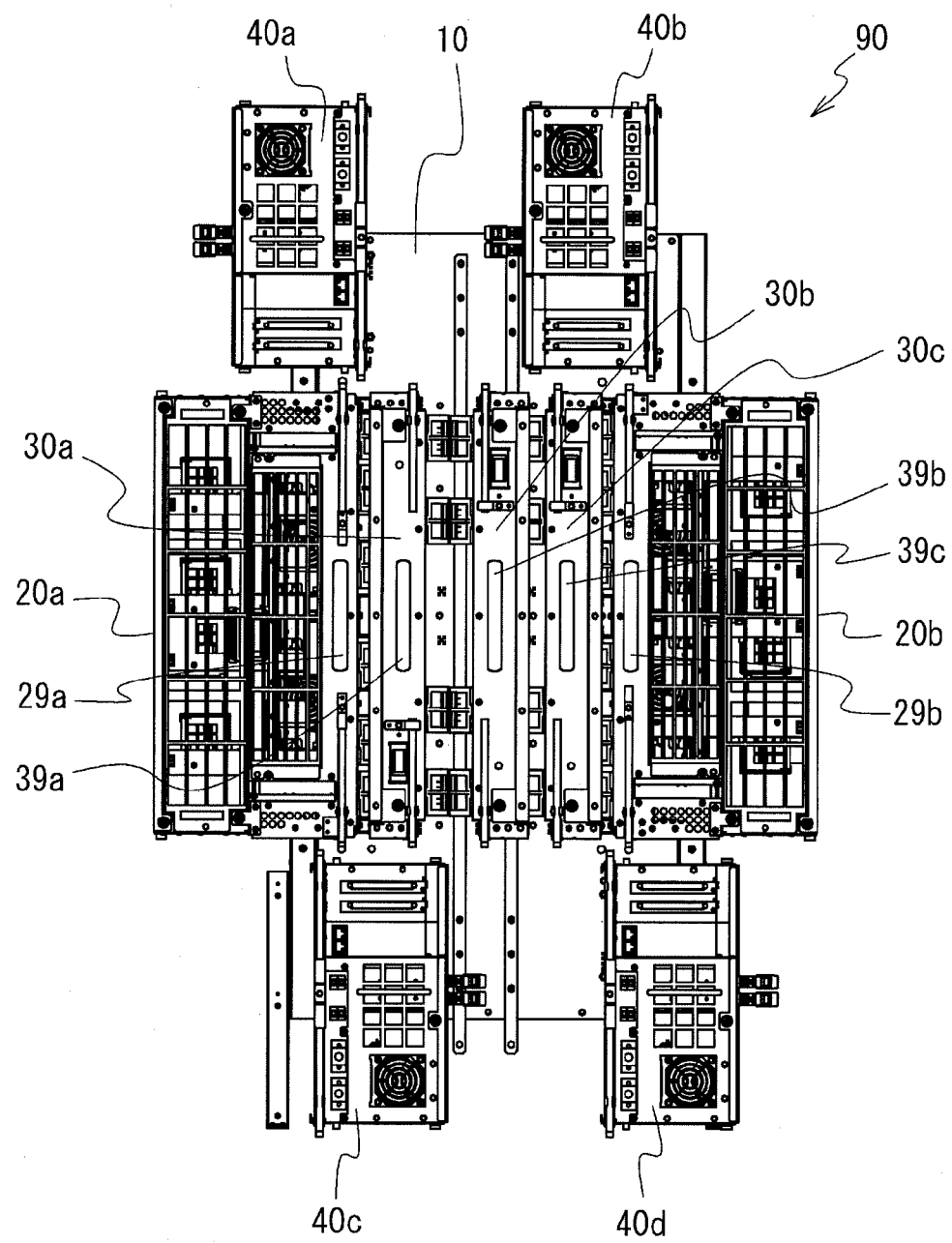
FIG. 2 is a front view of a unit system.
Figure 3:
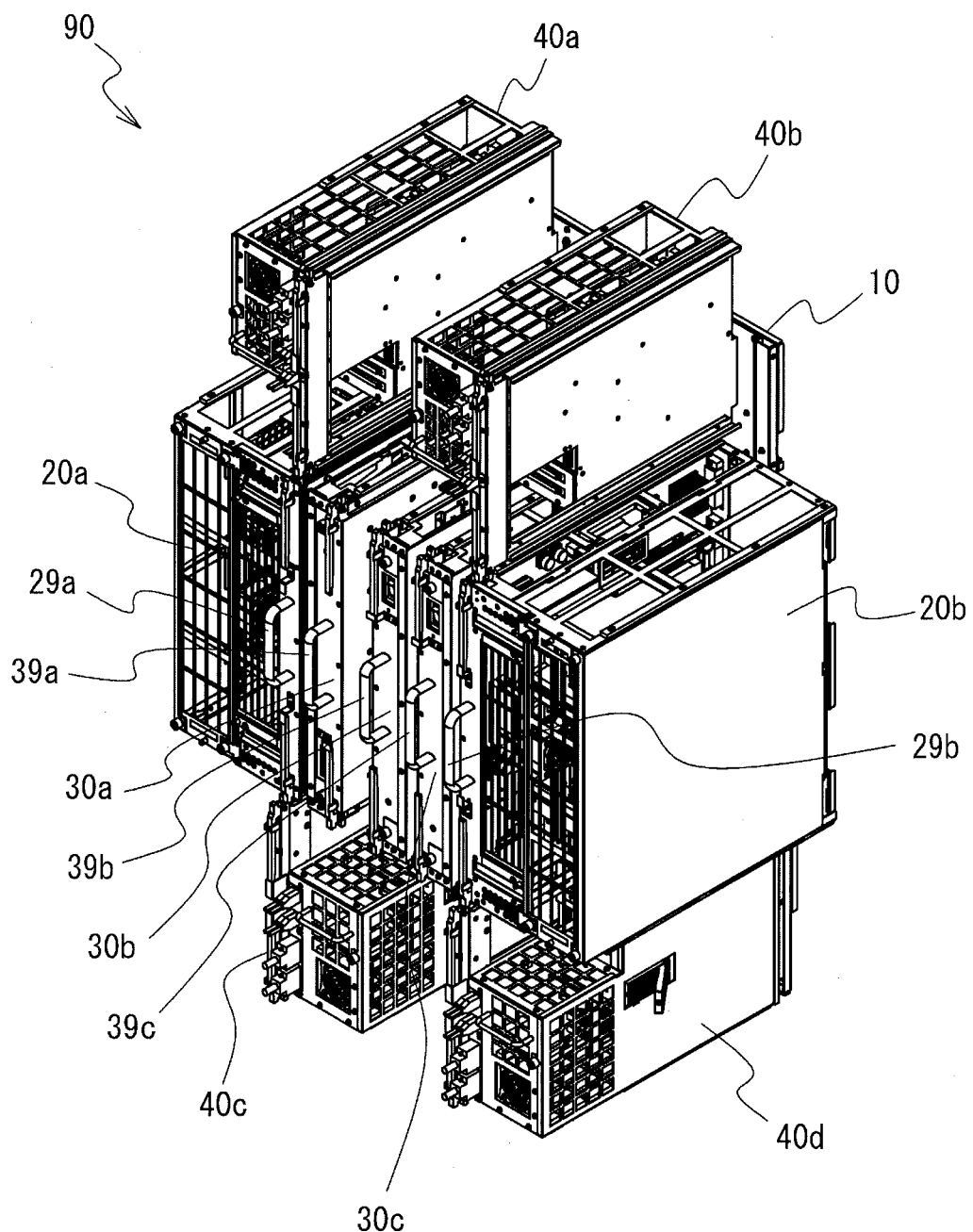
FIG. 3 is a perspective view of the unit system.
Figure 4:
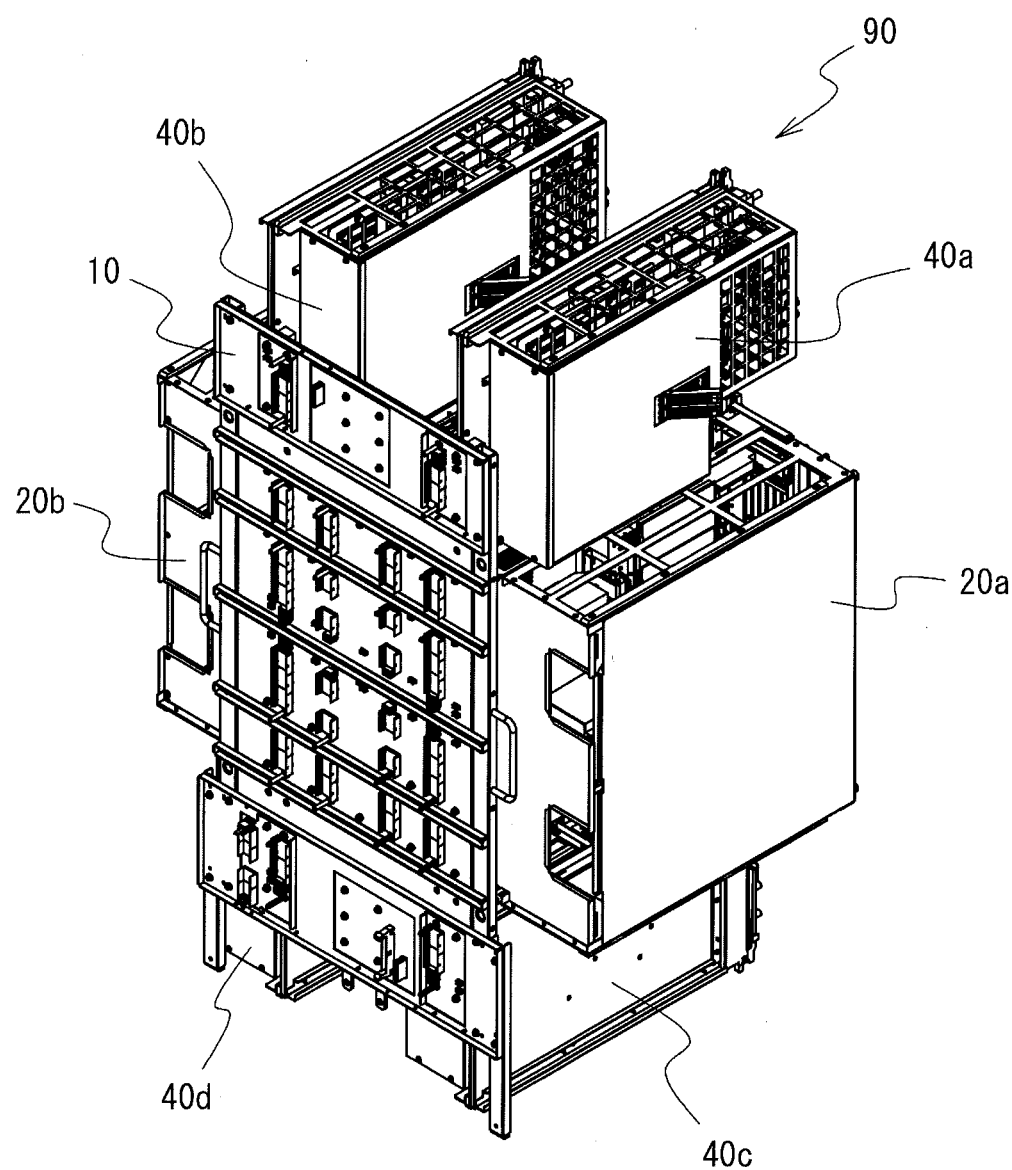
FIG. 4 is a perspective view of the unit system when viewed from its back.

Next, a unit system 90 will be described. The unit system 90 includes: the backplane 10; and the units 20, 30, and 40 connected to the backplane. FIG. 2 is a front view of the unit system 90. FIG. 3 is a perspective view of the unit system 90. FIG. 4 is a perspective view of the unit system 90 when viewed from its back. Additionally, units connected to the back surface of the backplane 10 are omitted in FIGS. 2 to 4.

The units 20 include a unit (electronic units) 20a and 20b. The units 30 include units 30a to 30c. The units 40 include units 40a to 40d. The units 20, 30, 40 are connected to the same side of the backplane 10. The units 40a and 40b are connected at the upper portion of the backplane 10. The units 40c and 40d are connected at the lower portion of the backplane 10. The units 20a, 20b, and 30a to 30c are connected at the middle portion of the backplane 10.

Each thickness of the units 30a to 30c connected at the middle portion of the backplane 10 is smaller than each of that of the units 20a and 20b. Also, the units 20a, 20b, 30a to 30c, and 40a to 40d each have a unit board as will be described below.

The units 20a, 20b, and 30a to 30c are respectively provided with handles 29a, 29b, and 39a to 39c for respectively attaching to and detaching from the units 20a, 20b, and 30a to 30c to/from the backplane 10.

The units 40a and 40b face the same direction and are connected to the backplane 10, as illustrated in FIGS. 2 to 4. Also, the units 40c and 40d are connected to the backplane 10 with faced the same direction. Further, the units 40a to 40d are connected to the backplane 10 with the units 40a and 40b and the unit 40c and 40d facing oppositely to each other.

The units 20a and 20b are arranged at the most outside of the middle portion of the backplane 10 and face oppositely to each other.

Figure 5:
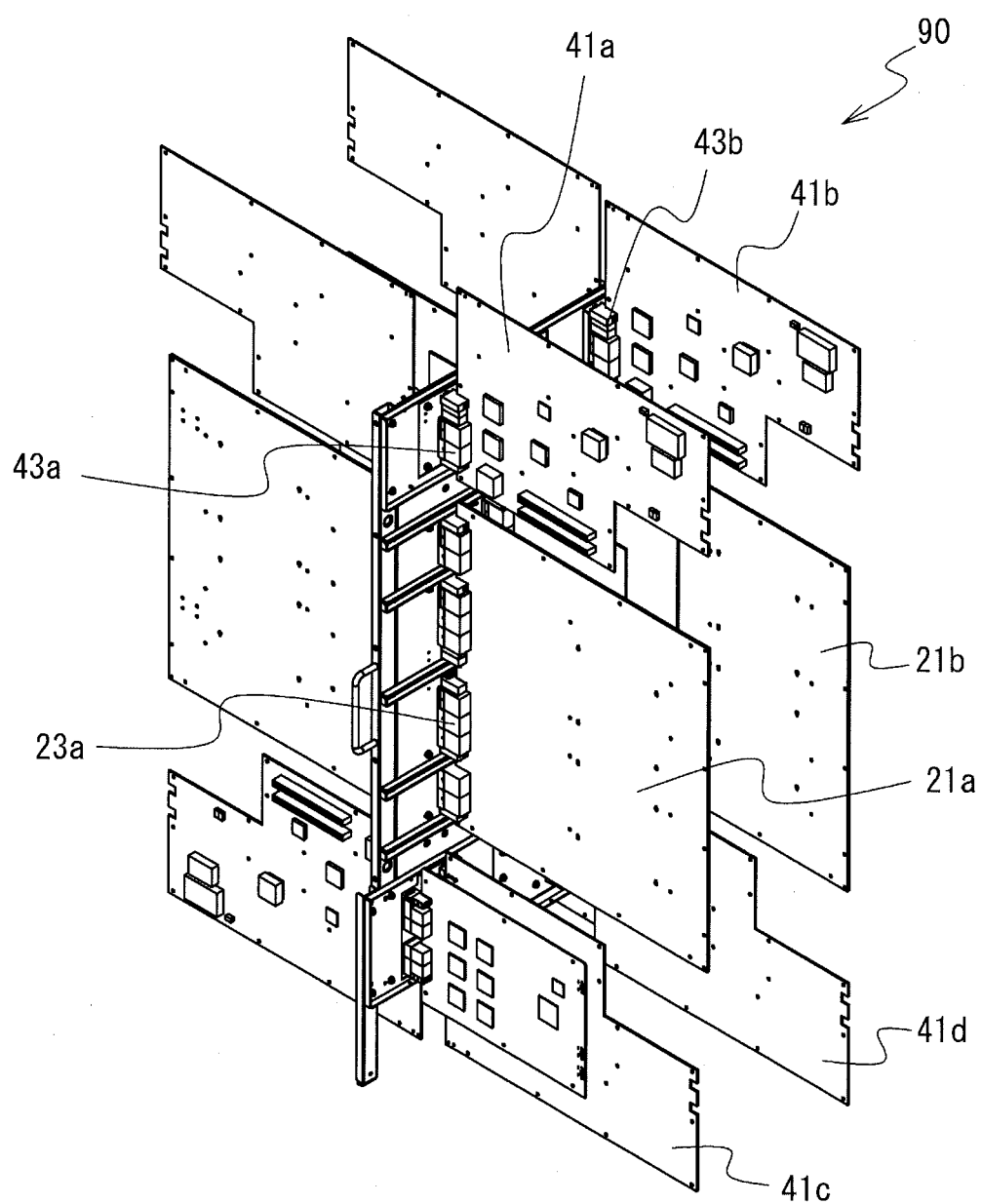
FIG. 5 is a view of the connection between the backplane and unit boards.
Figure 6:
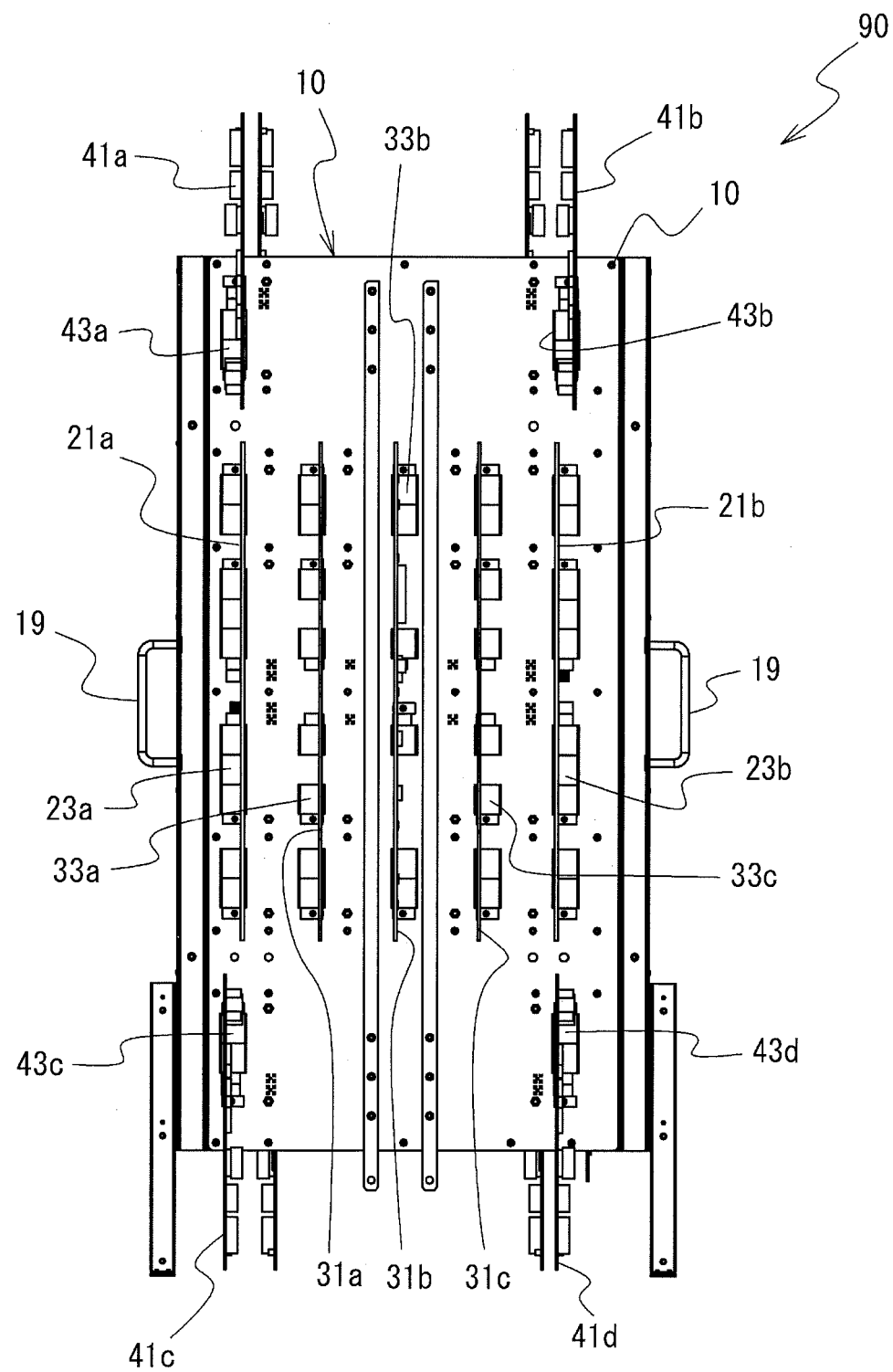
FIG. 6 is a view of the connection between the backplane and the unit boards.
Figure 7:
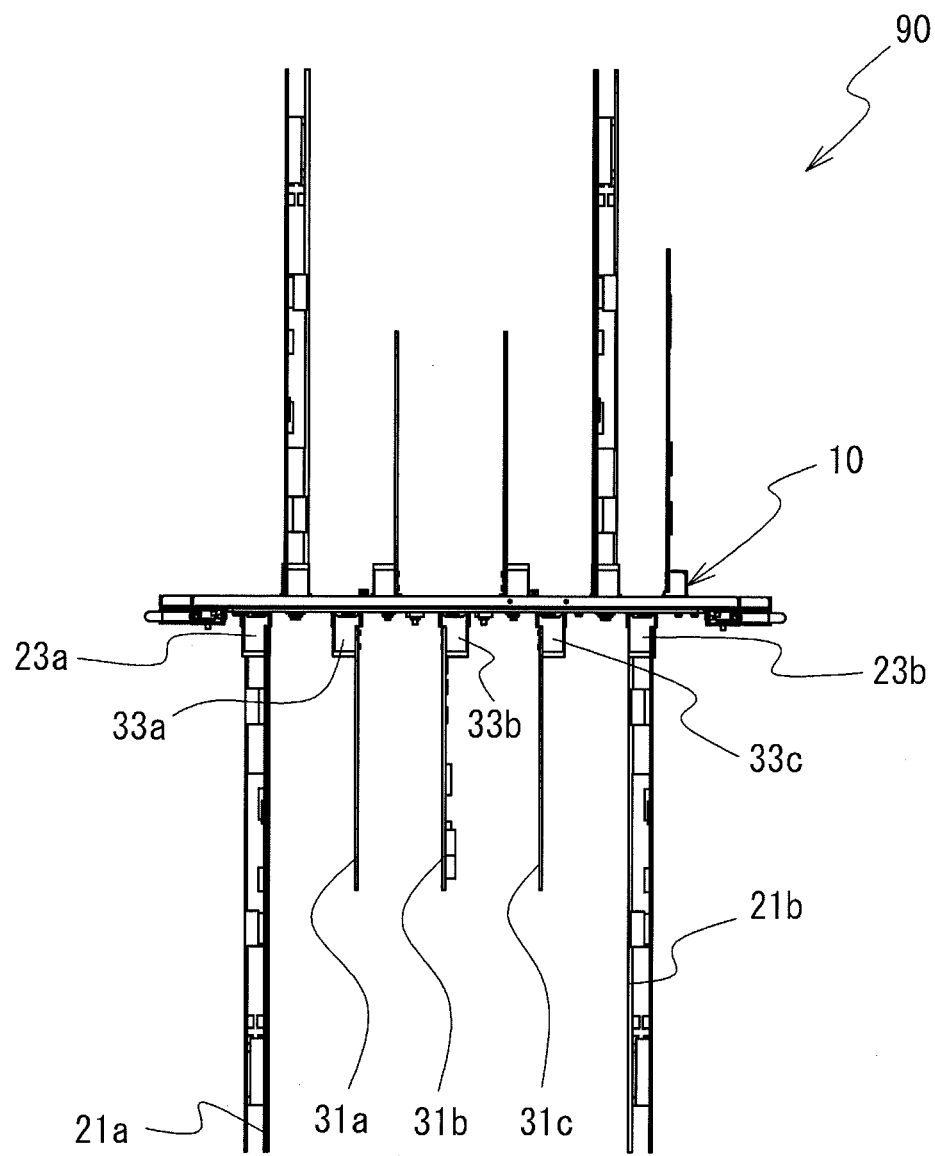
FIG. 7 is a view of the connection between the backplane and the unit boards.

Next, the unit boards will be described. FIGS. 5 to 7 are views of the connection between the backplane 10 and the unit boards. Additionally, unit boards of the units connected to the back side of the backplane 10 are illustrated in FIGS. 5 to 7. Electronic parts mounted on each unit board is omitted in FIGS. 5 to 7.

As illustrated in FIGS. 5 to 7, the unit 20a, 20b, 30a to 30c, and 40a to 40d have the unit boards 21a, 21b, 31a to 31c, and 41a to 41d, respectively. These unit boards 21a, 21b, 31a to 31c, 41a to 41d are provided at their given surfaces with connectors 23a, 23b, 33a to 33c, and 43a to 43d, respectively. The connectors 23a, 23b, 33a to 33c, and 43a to 43d ensure the electrical connection between the backplane 10 and the unit boards 21a, 21b, 31a to 31c, and 41a to 41d, respectively.

Plural connectors are provided in one unit board. Also, the backplane 10 is provided with plural connectors corresponding to the connectors provided in the unit boards. Handles 19 are respectively provided at the sides of the backplane 10.

The connectors provided in the backplane 10 are electrically connected to the connectors respectively provided in the unit boards, thereby supplying the signals and electricity to the electronic parts mounted on the unit boards. The electronic parts are mounted on given surfaces of the unit boards 21a, 21b, 31a to 31c, and 41a to 41d. These electronic parts generate heat when the electricity is supplied thereto.

The connector provided in the unit board is mounted on the same surface on which the electronic parts are mounted. The surface on which the electronic parts are mounted is referred to as mounting surface. Additionally, when the electronic parts are mounted on both surfaces of the unit board, the electronic part having a high profile mounted on the surface is referred to as a mounting surface.

As illustrated in FIG. 7, the mounting surface of the unit board 31a oppositely faces mounting faces of the unit board 31b and 31c.

Figure 8A:
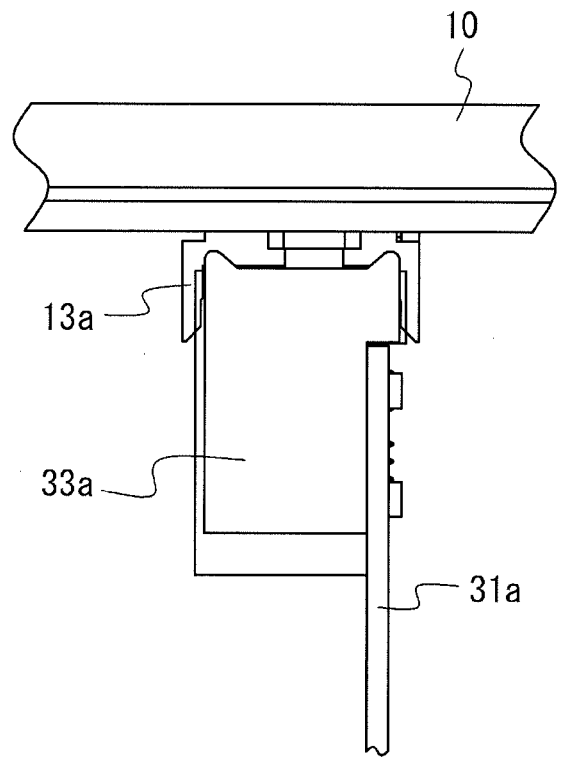
FIGS. 8A and 8B are explanatory views of detachment of the connector.
Figure 8B:
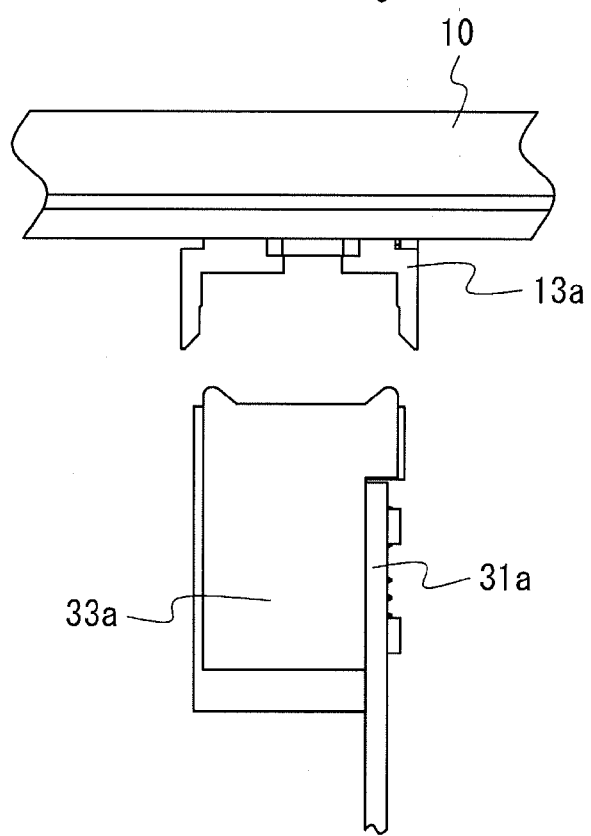

Next, a brief description will be given of attachment and detachment of the connector provided in the backplane 10 and the connector provided in the unit board. FIGS. 8A and 8B are explanatory views of the attachment and detachment of the connectors.

FIG. 8A is an enlarged view around the connector 33a provided in the unit board 31a. As illustrated in FIG. 8A, the connector 33a is connected to connector 13a provided in the backplane 10. FIG. 8B illustrates the state that the connector 33a is detached from the connector 13a.

The direction is so defined as to insert the connector 33a to the connector 13a. For example, it is impossible to detach the unit board 31a as illustrated in FIG. 8A and reverse the unit board 31a to insert the connector 31a into the connector 13a. Additionally, this applies to the other connectors provided in backplane 10.

As described above, the units 20a and 20b each being thicker than the units 30a to 30c are arranged in the most outside of the middle portion of the backplane 10. Moreover, the unit 20a and 20b face oppositely to each other, and the mounting surfaces face the outside of the backplane 10, as illustrated in FIG. 5 to FIG. 7. The unit 20a and the unit 30a adjacent to the unit 20a can be closely arranged and connected to the backplane 10 while preventing interference of the units 20a and 30a. This configuration also applies to the unit 20b and the unit 30c adjacent to the unit 20b. Therefore, the unit system 90 can be downsized, whereby the frame 100 can be downsized. Also, the connectors of the backplane 10 connected to the unit boards 21a and 21b can be arranged closely to another connector adjacent to these connectors of the backplane 10. This can downsize the backplane 10.

The units 20a, 20b, and 40a to 40d protrude from the backplane 10. Hence, in a case where a cooling fan (not illustrated) is provided within the frame 100, there is little resistances against the ventilation caused by the backplane 10 at the portions protruding from the backplane 10. This can cool the units efficiently. Therefore, the cooling efficiency improves.

Figure 9A:
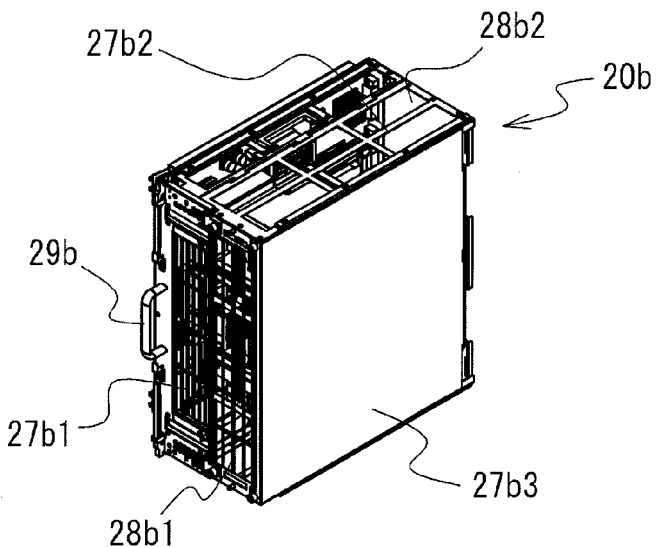
FIG. 9 is an explanatory view of the unit.
Figure 9B:
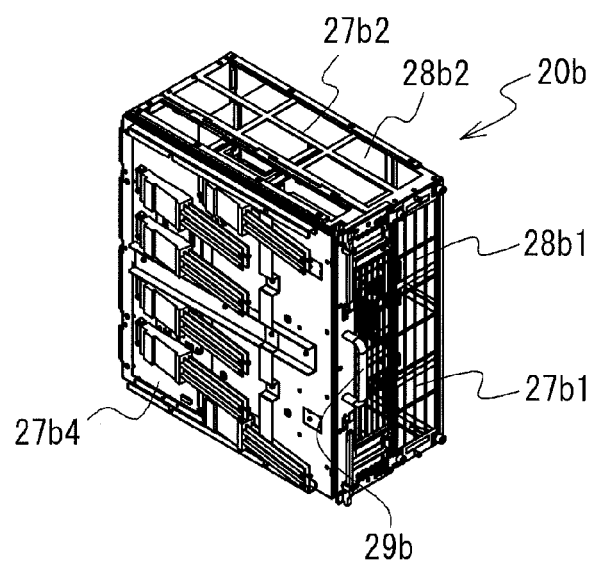
Figure 9C:
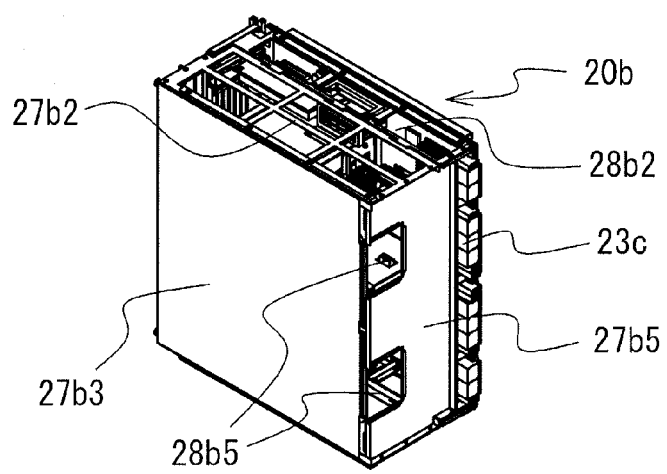

Next, air openings provided in the unit will be explained. FIGS. 9A to 9C are explanatory views of the unit 20b. FIG. 9A is a perspective view of the unit 20b when viewed from its right side. FIG. 9B is a perspective view of the unit 20b when viewed from its left side. FIG. 9C is a perspective view of the unit 20b when viewed from its rear side.

The unit 20b is provided at its front with a front panel 27b1 made of a metal. The front panel 27b1 has a fence-shape and is provided with plural air openings 28b1. Likewise, a top panel 27b2 is provided with plural air openings 28b2. A back panel 27b5 is also provided with two air openings 28b5. Side panels 27b3 and 27b4 are not provided with a air opening. The air openings 28b1, 28b2 and 28b5 function to introduce the ventilation by the cooling fan into the unit 20b and to exhaust therefrom. Also, as illustrated in FIG. 4, the air openings 28b5 formed in the back panel 27b5 protrude from the backplane 10, thereby introducing the ventilation into the unit 20b. Accordingly, cooling efficiency improves.

Figure 10A:
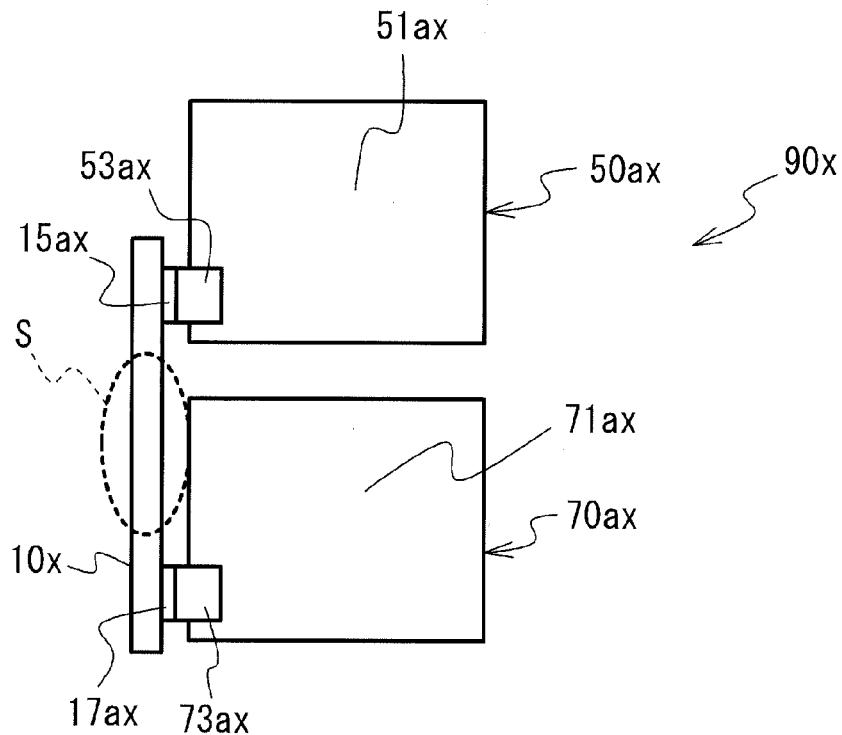
FIGS. 10A and 10B are comparative views of a unit system according to a second embodiment and a unit system having a structure different from that of the unit system according to the second embodiment.
Figure 10B:
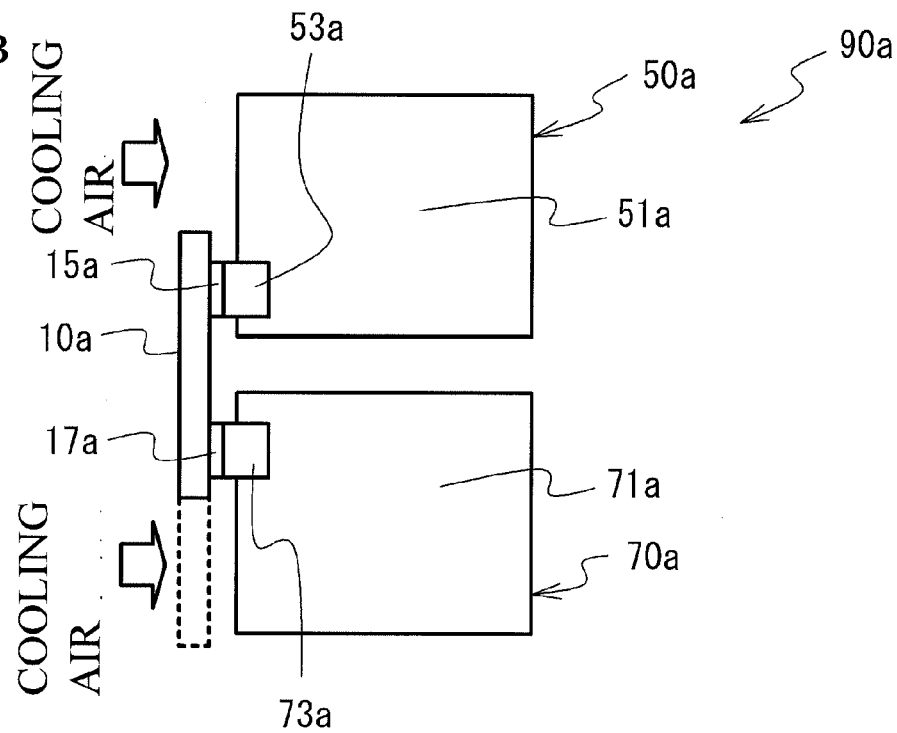

Next, a unit system 90a according to a second embodiment will be described. FIGS. 10A and 10B are comparative views of a unit system according to a second embodiment and a unit system having a structure different from that of the unit system according to the second embodiment. FIG. 10A is a side view of the unit system 90x. FIG. 10B is a side views of the unit system 90a. Additionally, each member is simplified in FIGS. 10A and 10B.

As illustrated in FIG. 10A, a unit 50ax is connected to a backplane 10x through a connector 15ax provided in the backplane 10x and a connector 53ax provided in the unit board 51ax. These structures apply for the unit 70ax.

As illustrated in FIG. 10A, the units 50ax and 70ax face the same direction in the lengthwise direction with respect to the backplane 10x and are connected thereto. That is, the connectors 15ax and 17ax, which are respectively connected to the connectors 53ax and 73ax, face the same direction. For this reason, the backplane 10x is upsized by a space S corresponding to the height of the unit 70ax.

On the other hand, units 50a and 70a face oppositely to each other in the lengthwise direction with respect to the backplane 10a and are connected to the backplane 10a, as illustrated in FIG. 10B. That is, the connectors 15a and 17a, which are respectively connected to the connectors 53a and 73a, face oppositely to each other. For this reason, the connector 15a and 17a can be closely arranged on the backplane 10a. Accordingly, as compared with the unit system 90x, the backplane 10a according to the second embodiment can be downsized. In addition, the backplane 10a is downsized as illustrated in FIG. 10B, both units 50a and 70a protrude from the backplane 10a. This improves the cooling efficiencies of the units 50a and 70a.

Figure 11A:
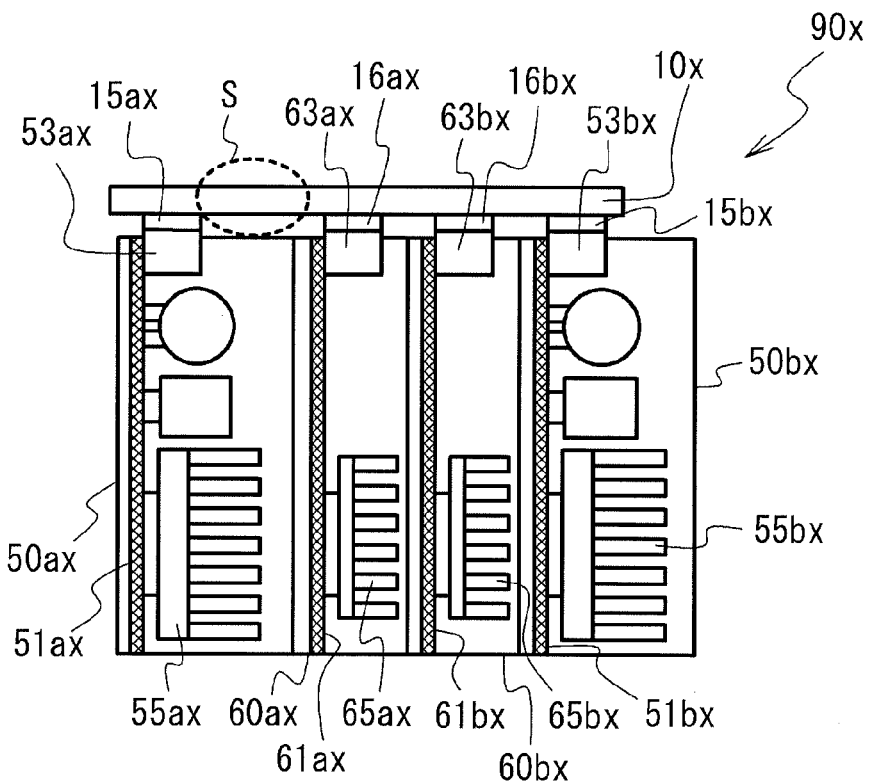
FIGS. 11A and 11B are comparative views of a unit system according to the second embodiment and the unit system having a structure different from that of the unit system according to the second embodiment.
Figure 11B:
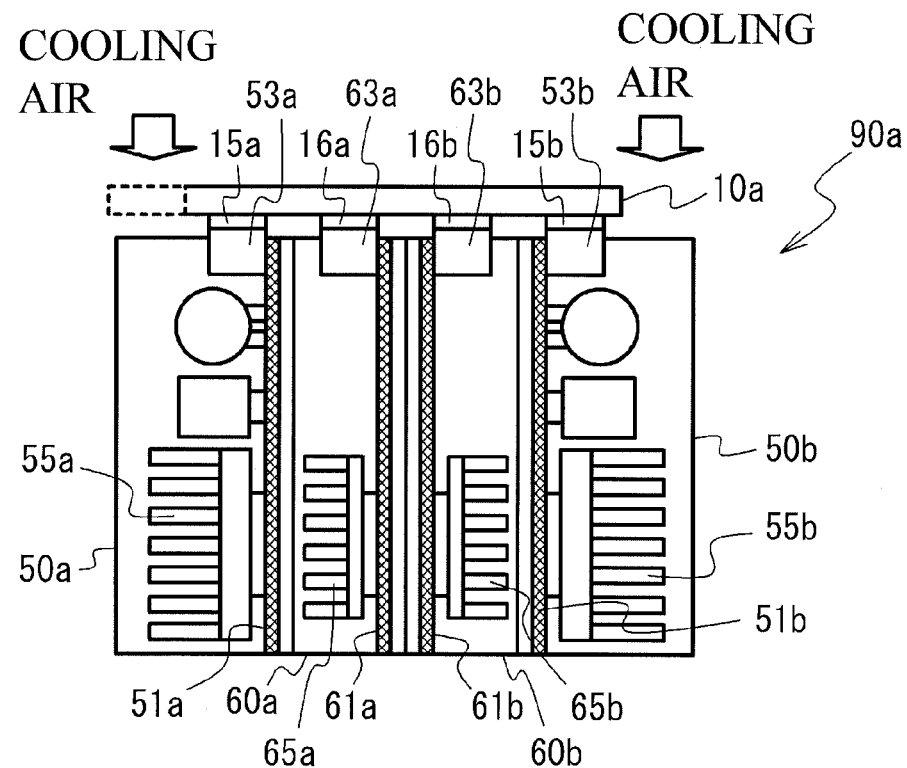

FIG. 11A is a top plan view of the unit system 90x. FIG. 11B is a top plan view of the unit system 90a. Additionally, each member is simplified in FIGS. 11A and 11B.

As illustrated in FIG. 11A, the units 50ax and 50bx are thicker than units 60ax and 60bx. Also, the units 50ax, 50bx, 60ax, and 60bx respectively include unit boards 51ax, 51bx, 61ax, and 61bx. Electronic parts 55ax, 55bx, 65ax, and 65bx are mounted on given surfaces of the unit boards 51ax, 51bx, 61ax and 61bx, respectively. The units 50ax, 50bx, 60ax and 60bx face the same direction. That is, the mounting surfaces of the unit boards 51ax, 51bx, 61ax, and 61bx face the same direction.

The unit board 51bx of the unit 50bx, which is arranged at the most outside of the backplane 10x, faces the outside of the backplane 10x. However, the unit board 51ax of the unit 50ax, which is arranged at the most outside of the backplane 10x and arranged at the opposite side of the unit 50bx, faces the inner side of the backplane 10x. For this reason, the connector 53ax is considerably spaced by the space S corresponding to the thickness of the unit 50ax from the adjacent connector 63ax. Thus, the connectors 15ax and 16ax have to be spaced from each other by the space S. Accordingly, the backplane 10x upsizes.

On the other hand, the units 50a and 60a and the units 50b and 60b oppositely face each other, as illustrated in FIG. 11B. The units 50a and 50b are respectively arranged at the most outsides of the backplane 10a, and face the outside of the backplane 10a. That is, the mounting surfaces of the unit boards 51a and 51b respectively provided in the units 50a and 50b faces the outside of the backplane 10a.

Therefore, the connectors 15a and 16a are closely arranged without the interference of the units 50a and 60a. For this reason, the backplane 10a can be downsized. As a result, the cooling efficiency also improves.

Figure 12:
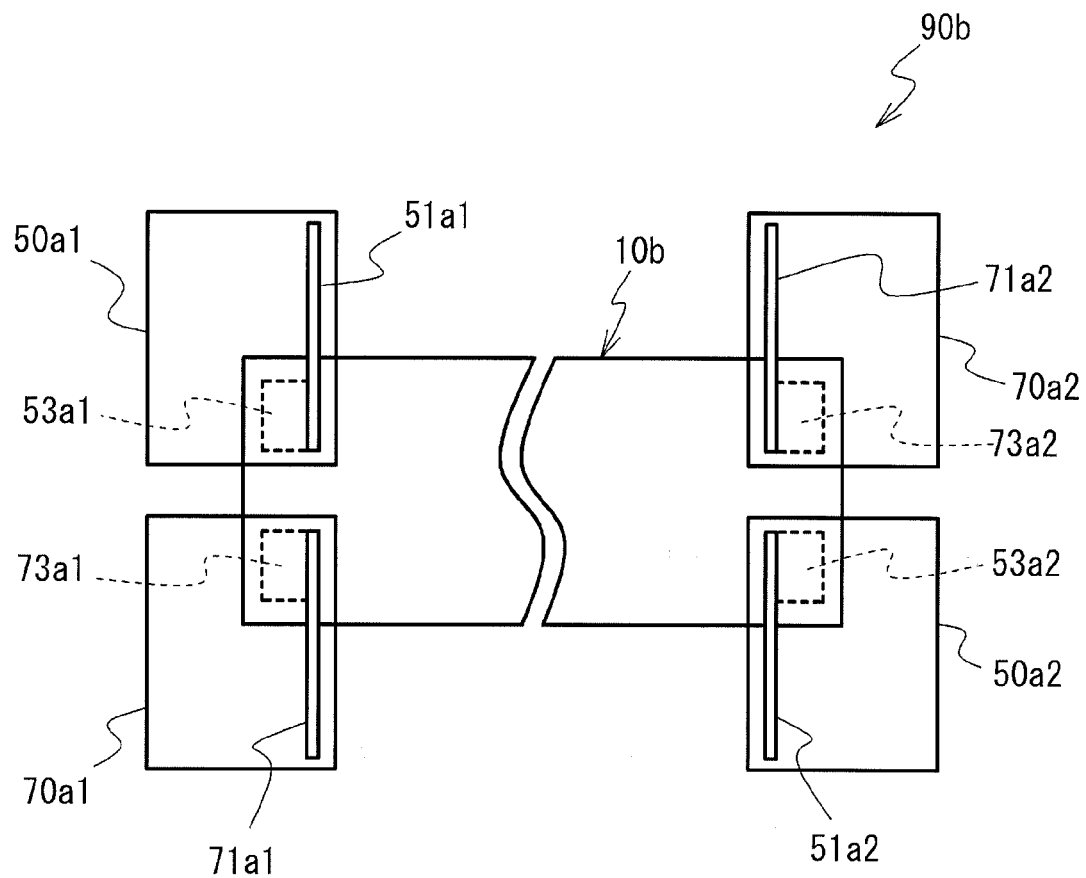
FIG. 12 is an explanatory view of a unit system according to a third embodiment.

Next, a unit system 90b according to a third embodiment will be described. FIG. 12 is an explanatory view of the unit system 90b according to the third embodiment.

Units 50a1 and 50a2 are diagonally arranged at the corners of the backplane 10. Units 70a1 and 70a2 are diagonally arranged at the other corners of the backplane 10. Additionally, the units 50a1 and 50a2 have the same structure, and the units 70a1 and 70a2 have the same structure. The unit 50a1, 50a2, 70a1 and 70a2 respectively have the unit boards 51a1, 51a2, 71a1 and 71a2. The unit board 51a1, 51a2, 71a1 and 71a2 are provided with connectors 53a1, 53a2, 73a1 and 73a2, respectively.

Also, plural units as not illustrated are connected to the backplane 10b between the units 50a1 and 70a2 and in addition to between units 70a1 and unit 50a2.

The upsides of the units 50a1 and 70a1 face oppositely to each other. Likewise, the upsides of the units 70a2 and 50a2 face oppositely to each other. The lateral sides of the units 50a1 and 70a2 face oppositely to each other rightwardly and leftwardly. Also, the units 70a1 and 50a2 face oppositely to each other rightwardly and leftwardly. In this way, the upsides, downsides, left sides, and right sides of the units 50a1, 50a2, 70a1 and 70a2 face oppositely to each other.

Accordingly, the connectors 53a1, 53a2, 73a1 and 73a2 can be closely arranged. Consequently, the backplane 10b can be downsized.

Also, the units 50a1, 50a2, 70a1 and 70a2 protrude from the backplane 10b, as illustrated in FIG. 12. This permits air to be efficiently sent to the units 50a1, 50a2, 70a1, and 70a2. This result improves the cooling efficiencies of the units 50a1, 50a2, 70a1, and 70a2.

Figure 13A:
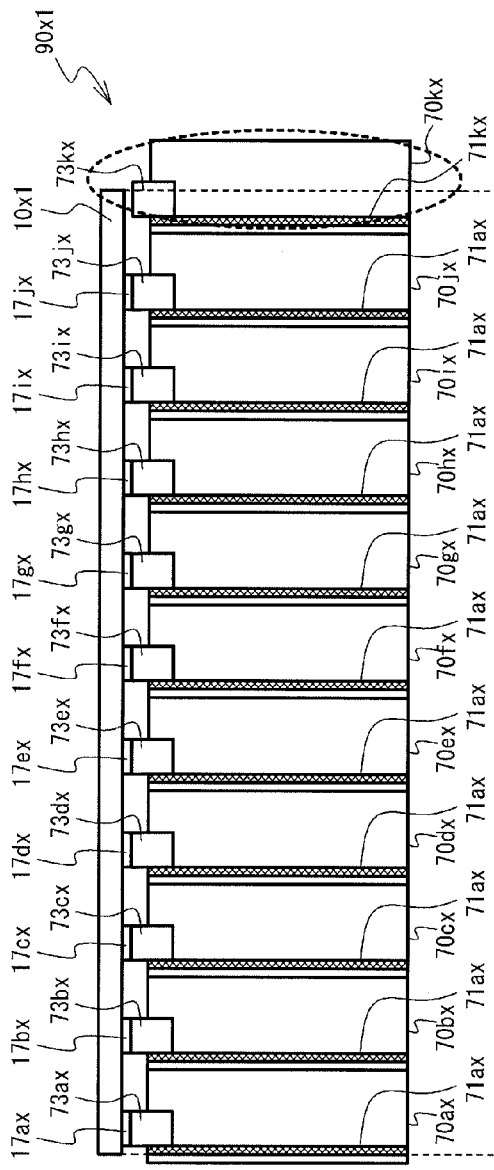
FIGS. 13A and 13B are comparative views of a unit system according to a fourth embodiment and a unit system having a structure different from that of the unit system according to a fourth embodiment.
Figure 13B:
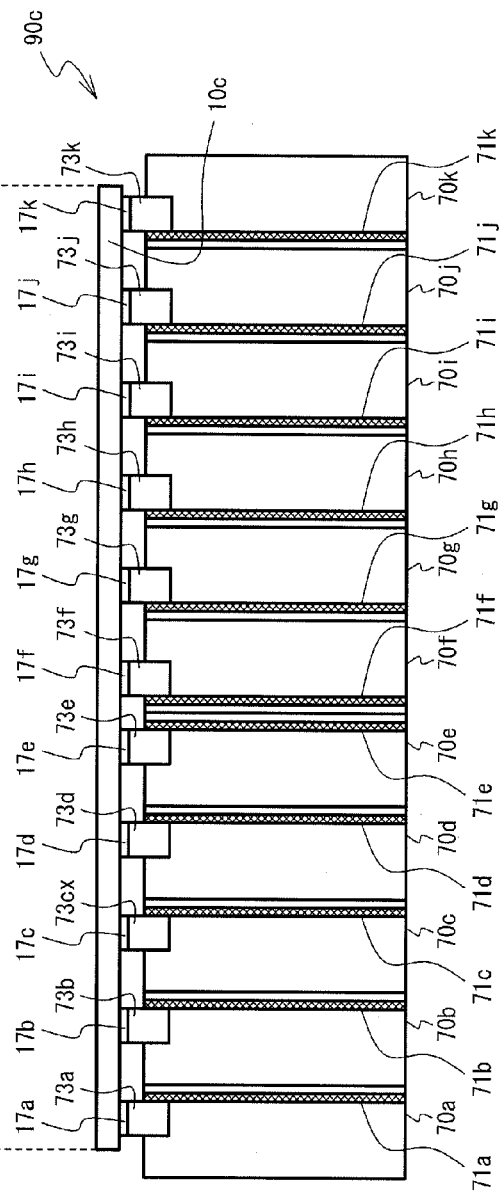

Next, a unit system 90c according to a fourth embodiment will be described. FIG. 13 are comparative views of a unit system 90c according to a fourth embodiment and a unit system 90x1 having a structure different from that of the unit system according to the fourth embodiment. FIG. 13A is a top view of the unit system 90x1. FIG. 13B is a top view of the unit system 90c.

As illustrated in FIGS. 13A and 13B, the backplane 10c of the unit system 90c and the backplane 10x1 of the unit system 90c are substantially identical to each other in size. Ten units 70ax to 70jx facing the same direction are connected to the backplane 10x1, as illustrated in FIG. 13A. Since the units 70ax to 70jx face the same direction, the distances between the adjacent connectors provided in the backplane 10x1 are equal.

In contrast, as illustrated in FIG. 13B, eleven units 70a to 70k are connected to the unit system 90c. The units 70a to 70e and the units 70f to 70k face oppositely to each other. That is, the units 70a to 70e face the same direction, whereas the units 70f to 70k face the opposite direction. Also, the units 70a and 70k arranged the most outside of the backplane 10c face the outside of the backplane 10c. Also, the units 70a and 70d protrude from the backplane 10c.

Also, adjacent units 70e and 70f face oppositely to each other. Accordingly, the connectors 17e and 17f can be closely provided in the backplane 10c. Thus, the space between the connectors 73e and 73f are smaller than that between the connectors 73e and 73d, and that between the connectors 73f and 73g. For this reason, connectors can be densely arranged in the backplane 10c.

In contrast, since connectors 17ax to 17jx provided in the unit system 90x1 are arranged at equal intervals, an eleventh connector 17kx cannot be provided in the backplane 10x1. Thus, only ten units can be connected to the backplane 10x1 at the maximum.

In other words, in a case where ten units are connected in the unit system 90c, the size of the backplane 10c can be made further smaller than the size of backplane 10x1.

Next, a unit system 90d according to a fifth embodiment will be described. FIGS. 14A and 14B are comparative views of a unit system 90d according to the fifth embodiment and a unit system having a structure different from that of the unit system 90d according to the fifth embodiment. FIG. 14A is a top view of the unit system 90x2 having a structure different from that of the unit system 90d. FIG. 14B is a top view of the unit system 90d.

As illustrated in FIG. 14A, six units 80ax to 80fx are connected to the backplane 10x2. Also, all the units 80ax to 80fx face the same direction. For this reason, the distances between the adjacent connectors provided in the backplane 10x2 are equal.

On the other hand, as illustrated in FIG. 14B, six units 80a to 80f are connected to the backplane 10d. When the thicknesses of the units 80ex and 80 are compared, the unit 80e is thicker than the unit 80ex, as illustrated in FIGS. 14A and 14B. Also, the backplanes 10x2 and 10d are substantially identical to each other in size.

In the unit system 90d according to the fifth embodiment, the units 80a to 80c and the units 80d to 80f face oppositely to each other. Also, the units 80a and 80f are arranged at the most outside of the backplane 10 and are connected thereto. Also, as illustrated in FIG. 14B, the units 80c and 80d face oppositely to each other. Specifically, the mounting surface of the unit board 81c and the mounting surface of the unit board 81d do not face each other and face oppositely to each other. Accordingly, the space between the connectors 83c and 83d is smaller than that of the connectors 83c and 83b, and that of the connectors 83d and 83e.

Thus, as compared with the backplane 10x2, the same number of the units 80a to 80f can be connected to the backplane 10d substantially identical to the backplane 10x2 in size, and the units 80a to 80f each being thicker than each that of the units 80ax and 80fx. In other words, in a case where units identical to each other, the backplane 10d can be further downsized.

Although the embodiment of the present inventions has been described in detail, it should be understood that the various changes, substitutions, and alterations could be made hereto without departing from the sprit and scope of the invention.

In the above embodiments, a server is explained as an example. However, the present invention can be applicable to a router or switching equipment.

What is claimed is:

1. An electronic apparatus comprising:
    a first connector;
    a second connector;
    a third connector;
    a fourth connector;
    a first electronic unit connectable to the first connector;
    a second electronic unit connectable to the second connector;
    a third electronic unit connectable to the third connector;
    a fourth electronic unit connectable to the fourth connector; and
    a printed circuit board that includes:
        a first surface on which the first and second connectors are mounted; and
        a second surface on which the third and fourth connectors are mounted,
    each of the first, second, third, and fourth units partially protruding from the printed circuit board when viewed in a direction perpendicular to the first surface and when the first, second, third, and fourth electronic units are respectively connected to the first, second, third, and fourth connectors.

2. The electronic apparatus according to claim 1, wherein the first and second electronic units include first and second unit boards including mounting surfaces on which first and second electronic parts are mounted, respectively, and
    the first and second mounting surfaces face a same direction.

3. The electronic apparatus according to claim 1, wherein the first and second electronic units include first and second unit boards including mounting surfaces on which first and second electronic parts are mounted, respectively, and
    the first and second mounting surfaces face oppositely to each other.

4. The electronic apparatus according to claim 1, wherein the first and second electronic units include first and second unit boards including mounting surfaces on which first and second electronic parts are mounted, respectively,
    the first and second electronic units are arranged at upper and lower sides of the printed circuit board, respectively, when viewed in the direction perpendicular to the first surface and
    a distance between an upper edge of the first electronic unit board and a lower edge of the second electronic unit board is larger than a distance between upper and lower edges of the printed circuit board, when the first and second electronic units are viewed in the direction perpendicular to the first surface.

* * * * *